United States Patent [19]

Manukonda et al.

[11] Patent Number: 5,102,816
[45] Date of Patent: Apr. 7, 1992

[54] STAIRCASE SIDEWALL SPACER FOR IMPROVED SOURCE/DRAIN ARCHITECTURE

[75] Inventors: V. Reddy Manukonda; Thomas E. Seidel, both of Austin, Tex.

[73] Assignee: Sematech, Inc., Austin, Tex.

[21] Appl. No.: 679,160

[22] Filed: Mar. 26, 1991

Related U.S. Application Data

[63] Continuation of Ser. No. 499,783, Mar. 27, 1990, abandoned.

[51] Int. Cl.$^5$ ................. H01L 21/336; H01L 27/092
[52] U.S. Cl. ........................... 437/44; 437/29; 437/30; 437/34; 437/41; 437/56; 437/67; 357/23.3
[58] Field of Search ............... 437/27, 28, 29, 30, 437/34, 40, 41, 44, 56, 57, 238, 241, 235; 357/23.3; 156/643, 650, 651, 652, 653, 646

[56] References Cited

U.S. PATENT DOCUMENTS

| | | | |
|---|---|---|---|
| 3,472,712 | 10/1969 | Bower . | |
| 3,475,234 | 10/1969 | Kerwin et al. . | |
| 3,615,934 | 10/1971 | Bower . | |
| 4,072,545 | 2/1978 | De La Moneda | 437/41 |
| 4,204,894 | 5/1980 | Komeda et al. | 437/44 |
| 4,356,040 | 10/1982 | Fu et al. . | |
| 4,384,301 | 5/1983 | Tasch, Jr. et al. | 357/23 |
| 4,488,351 | 12/1984 | Momose | 437/34 |
| 4,530,150 | 7/1985 | Shirato | 437/44 |
| 4,642,878 | 2/1987 | Maeda | 437/34 |
| 4,722,909 | 2/1988 | Parrillo et al. | 437/44 |
| 4,728,617 | 3/1988 | Woo et al. | 437/44 |
| 4,735,916 | 4/1988 | Homma et al. | 437/162 |
| 4,740,484 | 4/1988 | Norström et al. | 437/44 |
| 4,744,859 | 5/1988 | Hu et al. | 156/643 |
| 4,745,086 | 5/1988 | Parrillo et al. | 437/37 |
| 4,753,898 | 6/1988 | Parrillo et al. | 437/57 |
| 4,760,033 | 7/1988 | Mueller | 437/57 |
| 4,764,477 | 8/1988 | Chang et al. | 437/34 |
| 4,808,544 | 2/1989 | Matsui | 437/44 |
| 4,818,714 | 4/1989 | Haskell | 437/34 |
| 4,818,715 | 4/1989 | Chao | 437/44 |
| 4,826,782 | 5/1989 | Sachitano et al. | 437/162 |
| 4,837,180 | 6/1989 | Chao | 437/44 |
| 4,843,023 | 6/1989 | Chiu et al. | 437/44 |
| 4,855,247 | 8/1989 | Ma et al. | 437/44 |
| 4,873,557 | 10/1989 | Kito | 357/23 |
| 4,998,150 | 3/1991 | Rodder et al. | 437/44 |

FOREIGN PATENT DOCUMENTS

| | | |
|---|---|---|
| 0173953 | 3/1986 | European Pat. Off. . |
| 0268941 | 6/1988 | European Pat. Off. . |
| 0057024 | 12/1981 | Japan . |
| 0241267 | 11/1985 | Japan ................ 156/643 |
| 0160976 | 7/1986 | Japan . |
| 0118578 | 5/1987 | Japan . |
| 0173763 | 7/1987 | Japan . |
| 0046763 | 2/1988 | Japan ................ 437/34 |
| 0132164 | 5/1989 | Japan ................ 437/34 |
| 2214349 | 8/1989 | United Kingdom . |

OTHER PUBLICATIONS

Pfiester, "LDD MOSFET's Using Disposable Sidewall Spacer Technology", IEEE Electron Device Letters, vol. 9, No. 4, Apr. 1988, pp. 189-192.

(List continued on next page.)

Primary Examiner—Olik Chaudhuri
Assistant Examiner—M. Wilczewski
Attorney, Agent, or Firm—William W. Kidd

[57] ABSTRACT

Selective etching of a conformal nitride layer overlying a conformal oxide layer and a subsequent etching of the oxide layer provide for a staircase shaped sidewall spacer which is used to align source and drain regions during implantation. Extent of the implanted n−/n+ and/or p−/p+ regions within the substrate can be tightly controlled due to the tight dimensional tolerances obtained by the footprint of the spacer. Further the source/drain profiles can be utilized with elevated polysilicon and elevated polysilicon having subsequent salicidation.

14 Claims, 7 Drawing Sheets

OTHER PUBLICATIONS

IBM Technical Disclosure Bulletin, vol. 32, No. 5A, Oct. 1989, "Method for Making Lightly Doped Drain Shallow Junctions", pp. 110–111.

IBM Technical Disclosure Bulletin, vol. 28, No. 1, Jun. 1985, "New Scheme to Form Shallow N+ and P+ Junctions for MOS Devices", pp. 366–367.

2244 Research Disclosure (1989) Jul., No. 303, New York, U.S., "Method for Making Devices having Reduced Field Gradients at Junction Edges", p. 496.

1988 Symposium on VLSI Technology, Oh et al., Simultaneous Formation of Shallow-Deep Stepped Source/Drain for Sub-Micron CMOS, May 10–13, 1988, pp. 73–74.

IEEE, Nov. 1989, Lu et al., Submicrometer Salicide CMOS Devices with Self-Aligned Shallow-Deep Junctions, pp. 487–489.

IEEE, Feb. 1985, Matsumoto et al., An Optimized and Reliable LDD Structure for 1-$\mu$m NMOSFET Based on Substrate Current Analysis, pp. 429–433.

IEEE, Feb. 1986, Huang et al., A Novel Submicron LDD Transistor with Inverse-T Gate Structure IEDM 86, pp. 742–745.

IEEE, Oct. 1984, Oh and Kim, A New MOSFET Structure with Self-Aligned Polysilicon Source and Drain Electrodes, pp. 400–402.

IEEE, Jul. 1989, Yamada et al., Spread Source/Drain (SSD) MOSFET Using Selective Silicon Growth for 64Mbit Drams pp. 2.4.1–2.4.4.

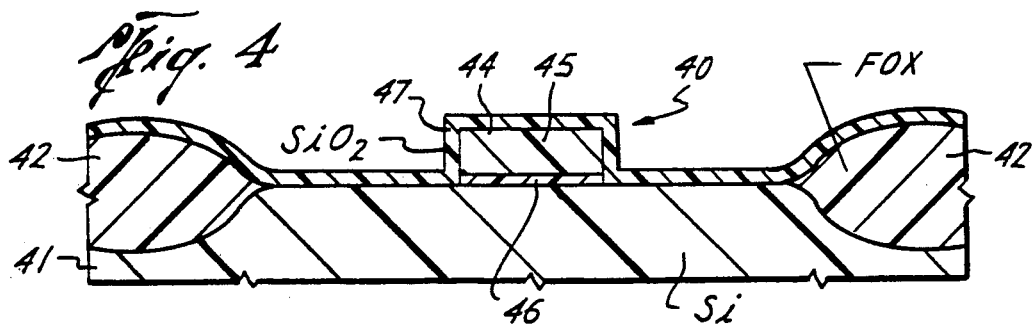
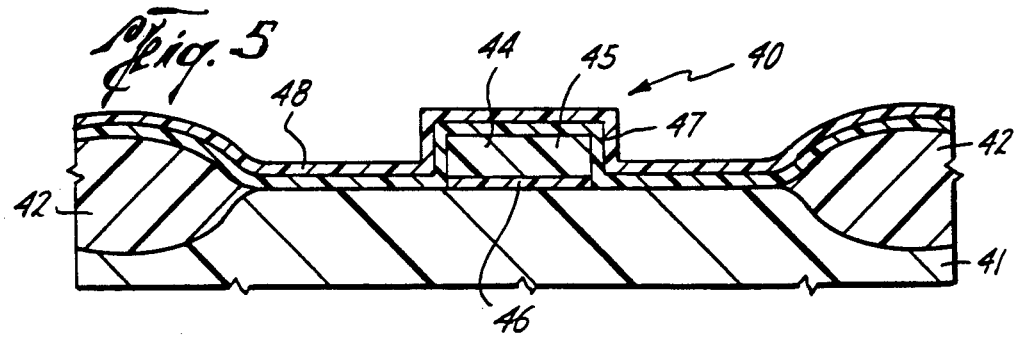
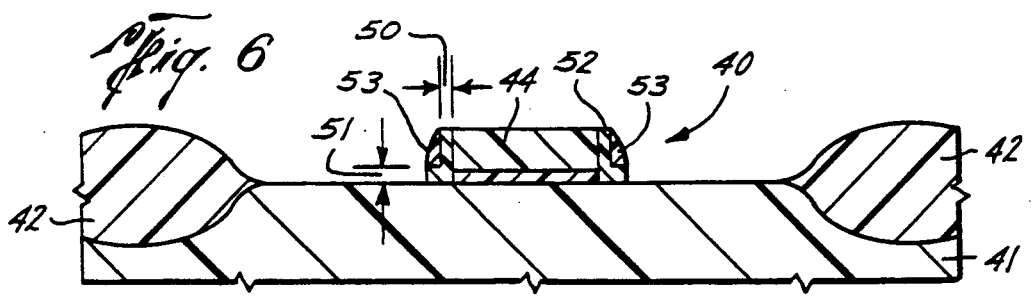
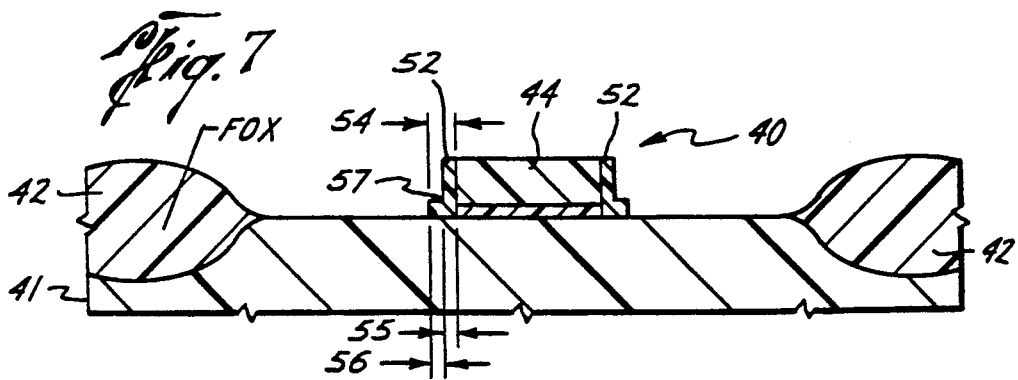

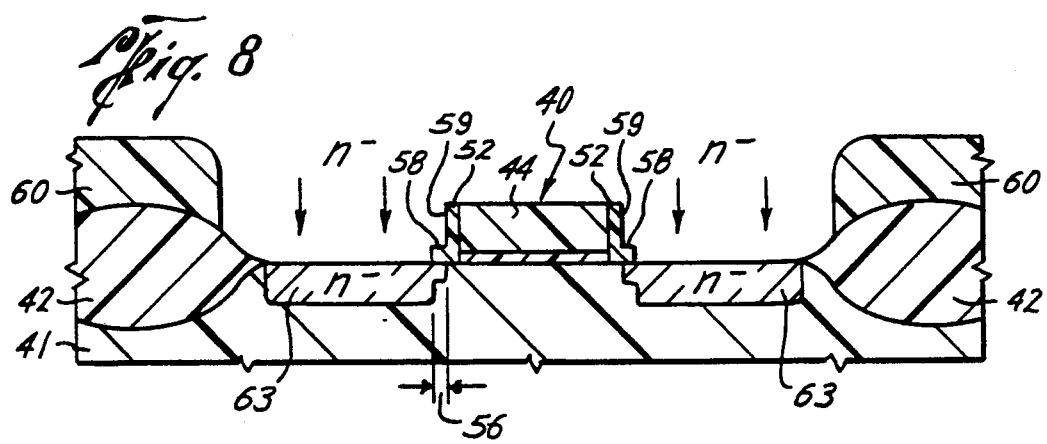
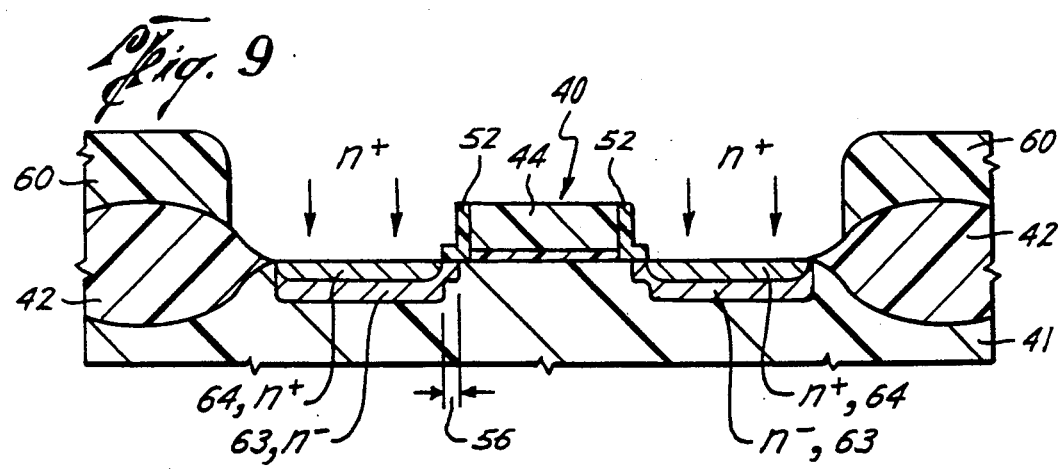
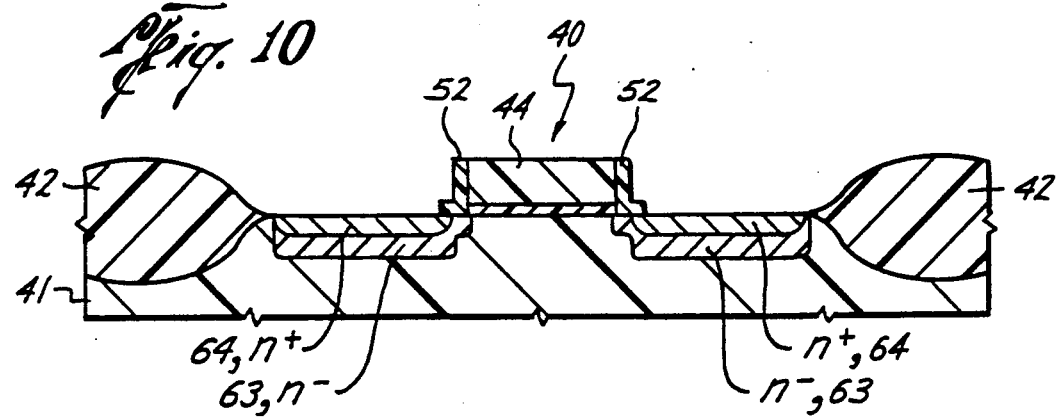

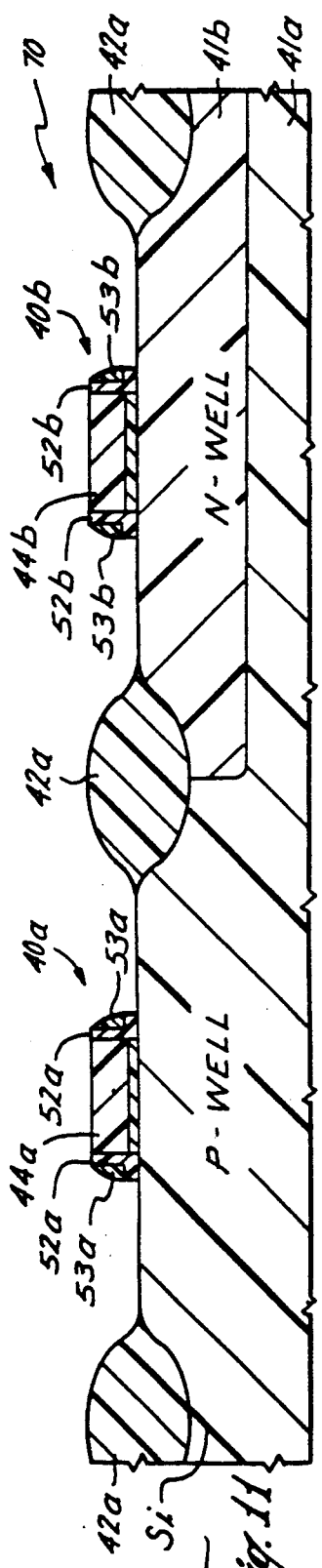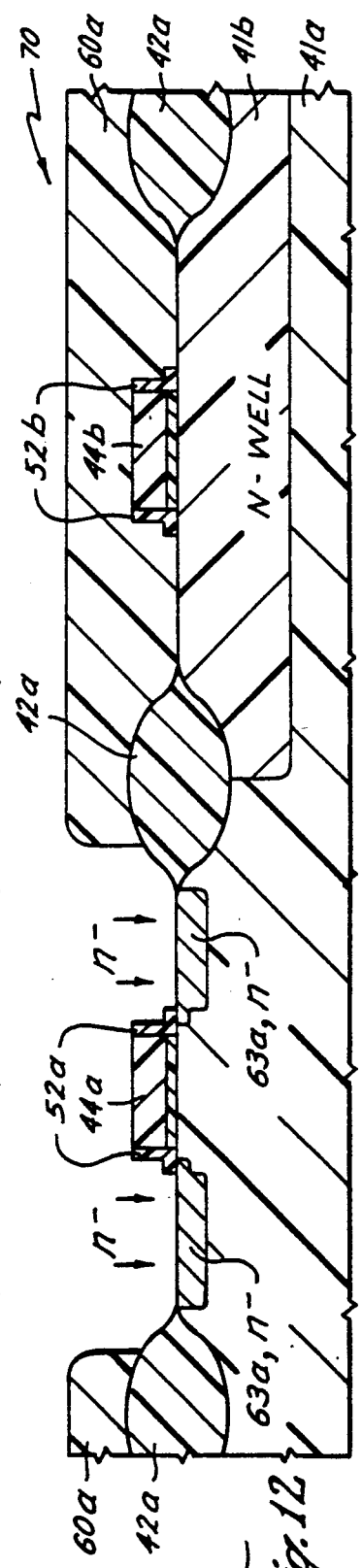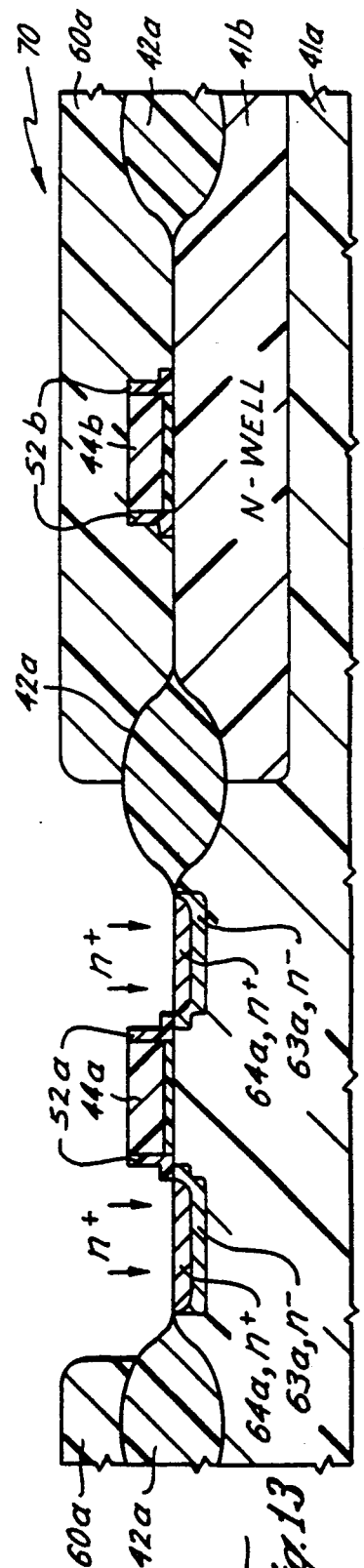

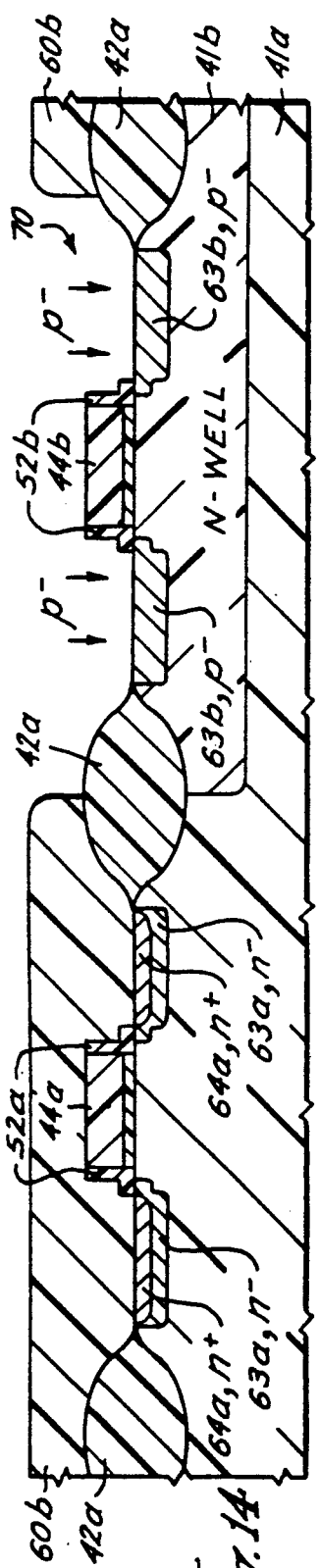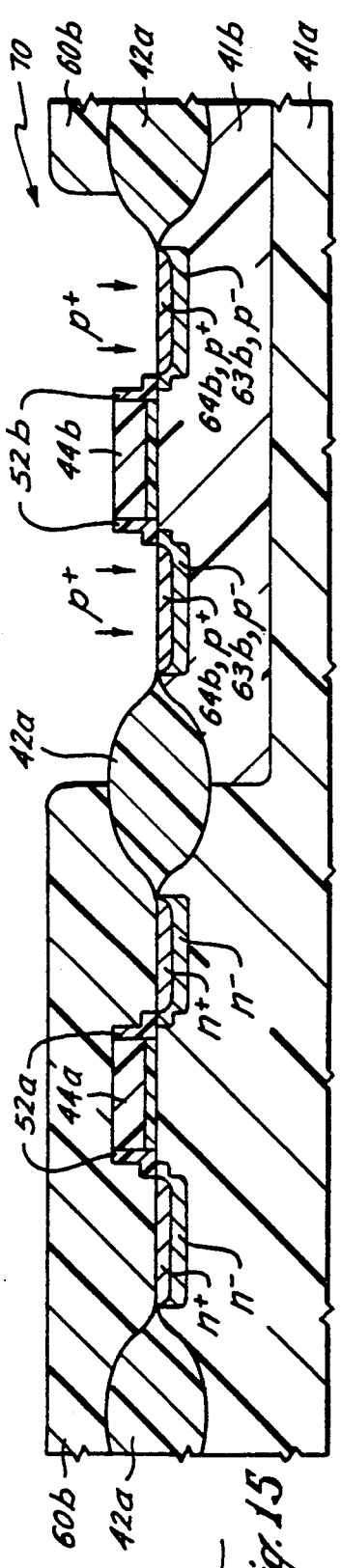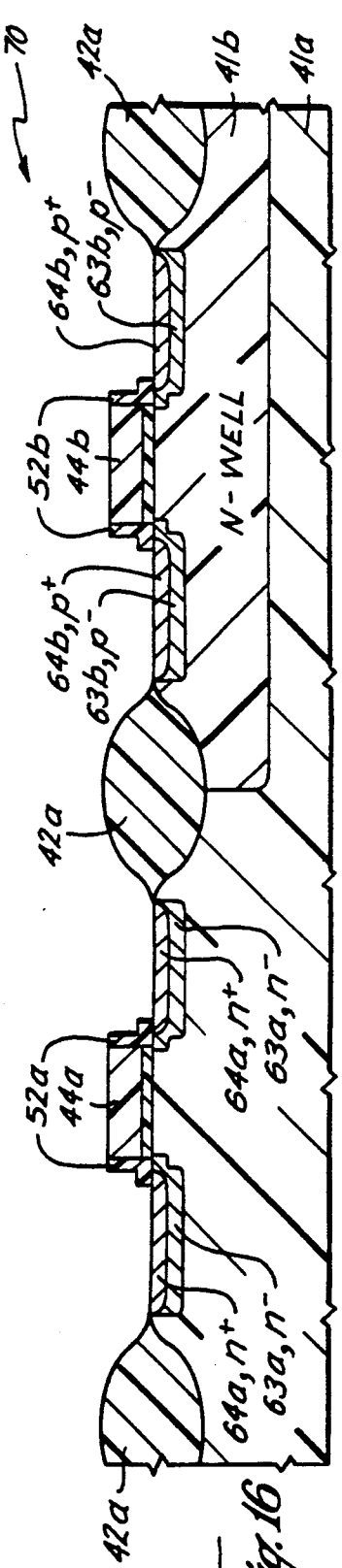

STAIRCASE SIDEWALL SPACER FOR IMPROVED SOURCE/DRAIN ARCHITECTURE

This application is a continuation, of application Ser. No. 499,783, filed Mar. 27, 1990, now abandoned.

BACKGROUND OF THE INVENTION

1. Field of the Invention

The present invention relates to the field of MOS integrated circuits and, particularly to the process of forming source and drain regions of a CMOS integrated circuit device.

2. Prior Art

In the design of integrated circuits various processes are known for fabricating the actual device. Techniques have evolved over the years in which various layers are formed onto a silicon substrate, wherein these layers are subjected to one or more of a variety of photolithographic, patterning, etching, exposing, implanting steps, etc., in order to form the desired device One type of integrated circuit is a metal-oxide semiconductor (MOS) field-effect transistor (FET) in which source and drain regions of the transistor are separated by a channel region underlying the gate of the transistor. Where the transistor is formed on the substrate, source and drain regions are formed in the substrate and the gate region resides above the surface of the substrate.

Typically the source and drain regions are formed by doping the substrate in the area where these regions are to be formed. Ion implantation is one technique for doping the source and drain. Using gate alignment, the gate or the gate and an adjacent dielectric spacer are used to align the substrate area where the doping is to occur. A well known practice is to provide a first implant to define a first implanted area and a second implant to define a second implanted area. The second implanted area is the actual source or drain and the first implanted area provides a graded doping or lightly doped region between the source or the drain from the channel, in order to provide improved device integrity, especially higher breakdown drain voltages.

Although these techniques are well-known, the various specific processes are applicable for fabricating devices of a certain size. As device geometry shrinks, attempts are made to form more and more transistors on a given area of a semiconductor wafer. For example, a semiconductor device fabricated utilizing "submicron" technology will contain many more circuit elements per unit area than a device fabricated using "above-micron" technology. However, as device size continues to shrink, the dimensional tolerances required of the various formed layers and/or devices also shrink and become more critical. Thus tolerances adequate for forming source and drain regions for a given size device, such as a device fabricated using 1.5 micron technology, may be inadequate for improved devices, such as a device fabricated using 0.35, 0.5 or even 0.8 micron technology.

The present invention provides for an improved method of forming source and drain regions in a semiconductor device, wherein the sharper definition, such as tighter control of source-drain spacing and source and drain doping profiles, of these regions permit for the fabrication of devices using submicron technology. Further, the improved method also provides for an ease of manufacture in fabricating the device.

SUMMARY OF THE INVENTION

A "staircase" gate sidewall spacer is described in which tighter dimensional tolerances of the spacer provides for a tighter control of source-drain spacing and source and drain doping profiles particularly as applied to "double doped" source and drain regions. The sidewall spacer is utilized to align areas of a substrate for ion implantation of the source and drain regions. The source and drain regions can be either an n-channel device or a p-channel device. By combining the n-channel and the p-channel, a CMOS device can be fabricated.

After a gate is formed over a substrate, a conformal oxide layer and then a conformal nitride layer are formed. Subsequent anisotropic etching leaves an oxide spacer adjacent to the gate sidewall, primarily due to the selective etching of the overlying nitride layer. After the removal of the remaining nitride by either isotropic or anisotropic etching, a staircase sidewall oxide spacer remains. Subsequently, an n−(or p−) implant is performed, followed by an n+ or (p+) implant to form the "double doped" source and drain regions.

Because the first implant is performed at a higher energy level, ions penetrate the lower portion of the stair case shaped spacer. The second implant is achieved at a lower energy level than the first, so that the ions do not readily penetrate the spacer. Thus, after annealing, in which ion damage is removed and the implants are controllably diffused further into the substrate, a separation region of n−(or p−) resides between the n+ or (p+) region and the channel region. Further, because the "footprint" dimensions of the spacers can be tightly controlled during their formation, sharper definition of the location of the source and drain regions is achieved.

Furthermore, considerable process simplification is achieved by the process architecture of the present invention. In particular, both n− and n+(or p− and p+) implants can be performed in one ion implant machine operation. Thus, reducing the process step count and allows for cost and yield-risk reduction in manufacturing.

BRIEF DESCRIPTION OF THE DRAWINGS

FIG. 4 is a cross-sectional view of the present invention showing a formation of a gate on a silicon substrate and a subsequent formation of an oxide layer above the gate and the substrate.

FIG. 5 is a cross-sectional view of a formation of a nitride layer over the oxide layer of FIG. 4.

FIG. 6 is a cross-sectional view of a gate region of a device of the present invention, in which sidewall spacers remain after etching the oxide and nitride layers of FIG. 5.

FIG. 7 is a cross-sectional view of the device of FIG. 6 after removal of the nitride remnant on the sidewall spacers.

FIG. 8 is a cross-sectional view showing an n− implant to form n− source and drain regions to the device of FIG. 7.

FIG. 9 is a cross-sectional view showing an n+ implant to form n+ source and drain regions to the device of FIG. 8.

FIG. 10 is a cross-sectional view showing the source and drain regions of the device of FIG. 9 after annealing, in which n−/n+ regions diffuse further into the substrate.

FIG. 11 is a cross-sectional view showing the formation of sidewall spacers to respective gates of both n-channel and p-channel areas of a CMOS device of the present invention.

FIG. 12 is a cross-sectional view showing an n− implant to form n− source and drain regions to the device of FIG. 11.

FIG. 13 is a cross-sectional view showing an n+ implant to form n+ source and drain regions to the device of FIG. 12.

FIG. 14 is a cross-sectional view showing a p− implant to form p− source and drain regions to the device of FIG. 13.

FIG. 15 is a cross-sectional view showing a p+ implant to form p+ source and drain regions to the device of FIG. 14.

FIG. 16 is a cross-sectional view showing the CMOS device of FIG. 15 after annealing.

DETAILED DESCRIPTION OF THE PRESENT INVENTION

A process for fabricating a semiconductor device using stepped spacer for improved formation of doped regions is described. A prior art technique is first described in order to provide a better understanding of the advantages derived by the practice of the present invention. In the following description, numerous specific details are set forth, such as specific thicknesses, temperatures, etc., in order to provide a thorough understanding of the present invention. It will be obvious, however, to one skilled in the art that the present invention may be practiced without these specific details. In other instances, well-known processes have not been described in detail in order not to unnecessarily obscure the present invention.

PRIOR ART

Figure 1:
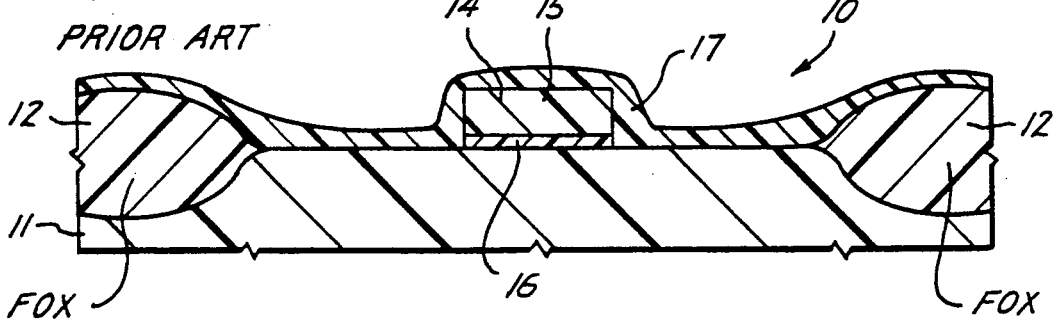
FIG. 1 is a cross-sectional view showing a formation of a gate and subsequent oxide layer to form a prior art MOS device.

Referring to FIG. 1, a prior art semiconductor device 10 is shown. Device 10 is a metal-oxide-semiconductor (MOS) device having a substrate 11, which substrate 11 is typically comprised of silicon. Circuit elements formed on substrate 11 are typically separated by field-oxide regions, such as field-oxide regions 12 of FIG. 1. A gate 14 is then formed on substrate 11. Gate 14 is typically comprised of a polysilicon region 15 separated from the substrate 11 by a dielectric region 16, which dielectric 16 is typically comprised of an oxide such as silicon oxide ($SiO_2$).

Utilizing a self-aligned technique, the gate 14 is used to define a channel region in the substrate 11 underlying the gate 14. A source and drain regions are then subsequently defined as the regions of the substrate bounding the channel region, such that the source and drain regions do not extend appreciably into the substrate 11 underlying gate 14. Prior to forming the source and drain regions, an oxide layer 17 is deposited.

Figure 2:
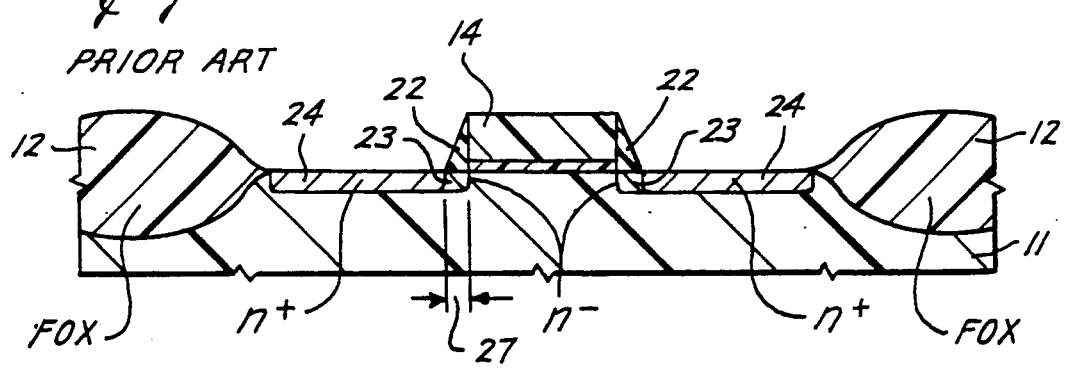
FIG. 2 is a cross-sectional view showing a formation of n−/n+ source and drain regions for the prior art device of FIG. 1.

By using well-known photoresist deposition, photolithographic and etching techniques, oxide layer 17 is etched to expose portions of substrate 11 for the purpose of forming the source and drain regions as shown in FIG. 2. The etching process is typically anisotropic such that a portion of oxide layer 17 remains adjacent to the vertical sides of gate 14. In some instances, a portion of the oxide layer 17 also remains above gate 14. The portion of the oxide layer 17 remaining adjacent to gate 14 is commonly referred to as a spacer, thus gate 14 is bounded by spacer regions 22, as shown in the cross-sectional illustration of FIG. 2.

Next, a masking technique is used to expose only those areas which will be subjected to implantation. As shown in FIG. 2, a n− region 23 is formed due to an n− implantation. Subsequently, a second masking step is utilized to define an area for performing the n+ implantation. The n+ region 24 resides within n− region 23 and this demarcation is especially important in the region proximate to the channel region underlying the gate 14. An annealing step is used to anneal the source and drain, which annealing step extends the n− and n+ regions further toward the channel region and in some instances, the n− region extends into the channel region, but not extending appreciably into the channel region underlying the gate 14. One such prior art technique to form n− and n+ ("double doped") source and drain regions is described in Matsumoto et al., "An Optimized and Reliable LDD Structure for 1-um NMOSFET Based on Substrate Current Analysis, IEEE Transactions on Electron Devices, Vol. ED-32, No. 2, Feb. 1985, pp 429–433, in which a lightly doped drain (LDD) structure is discussed.

The spacers 22, in conjunction with gate 14, function to align the substrate 11 for the implantation step. Spacers 22 are used to ensure that n− and n+ region 23 and 24 profiles are distinct and that the n−, or both n− and n+ regions 23 and 24, do not extend appreciably into the channel region underlying the gate 14. Further, it is to be noted that two separate masks and masking steps are necessary to first implant the n− region 23 and a second step to implant the n+ region 24 in order to provide a separation of the n+ region from the channel region for the purpose of providing better source and drain isolation from the channel region. In some instances the n+ region is doped first, followed by the doping of the n-region. An advantage of the n+ being performed first is that ion channeling effects can be reduced slightly.

The width of the region underlying each of the sidewall spacers 22 is commonly termed a "footprint". For device 10 of FIG. 2, a footprint for one of the sidewall spacers 22 is shown by the footprint distance 27. It is to be appreciated that the width of footprint 27 is a critical measurement for determining the extent of the horizontal penetration of n− region 23 in the substrate. A loose tolerance of the width of footprint 27 will necessarily result in a wide disparity of the extent of the penetration of n− region 23 and, hence, will more than likely impact the extent of the penetration of n+ region 24. The recognition of this variance is a key factor to the understanding the motivation behind the practice of the present invention. Therefore, it is desirable to maintain a small variance about a mean value specified for the width of the footprint 27.

Figure 3:
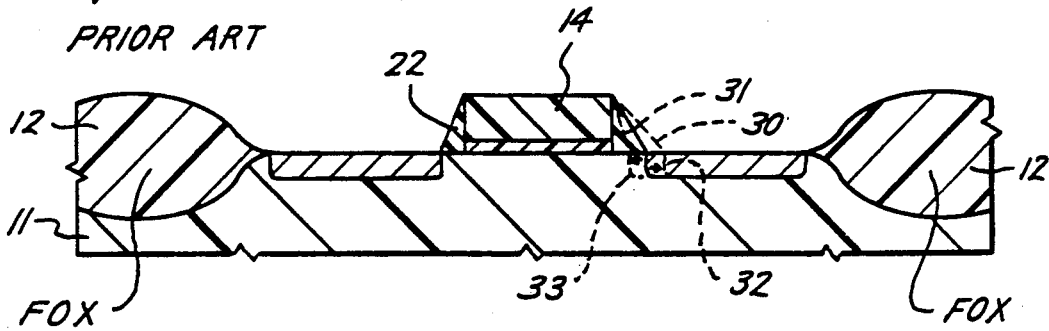
FIG. 3 is a cross-sectional view showing the unpredictability of the formation of source and drain regions of the prior art device of FIG. 2, due to variations in the slope of the sidewall oxide.

As shown in FIG. 3, a variation in the slope of the sidewall spacer 22 causes a corresponding difference in the width of the footprint 27 and this variation in the slope is illustrated by slope (shown as dotted lines) 30 and 31. This difference in the width of the footprint 27 will cause n+ region 24 and/or n− region 23 to vary correspondingly (shown as doped regions 32 and 33) from the channel region underlying the gate 14. Any significant variation of the location of n+ region 24 and/or n− region 23, will ultimately affect the operating parameters of the device 10, such as threshold, punchthrough voltage, and source-drain leakage current. It is to be noted that in the example of FIG. 3, doped region 33 can extend significantly toward or even into the channel region. When region 33 extends appreciably into the channel region, it can present an undesirable, or even fatal (in the case of extremely short channel devices), condition for the transistor.

A variety of factors affect the dimensional width of the footprint 27. More notable factors are the gate 14 profile, as well as its uniformity, slope of the sidewall spacer 22, depositon non-uniformity of oxide layer 17 and etch non-uniformity of oxide layer 17 to form sidewall spacer 22, the non-uniformity being across the wafer. Additionally, in some instances where the slope of the sidewall spacer 22 varies, during subsequent metal formation steps, metal "stringers" can extend from the metal contacts at the source and/or drain regions, along the sidewall 22 to a gate contact line residing on the upper portion of the gate 14. This condition can cause an electrical short of the source and/or drain to the gate.

Finally it is to be noted that similar problems are encountered in the formation of a p-channel device. The p− and p+ implants are equivalent to the n− and n+ implants, respectively. However, the results or effects of the footprint tolerance variation appears to be more pronounced with n-channel devices than with p-channel devices. Furthermore, it is appreciated that the variation in the footprint 27 is less critical when applicable to a device utilizing 1.5 micron technology since the tolerances are not as critical. But when a device using smaller micron technology, such as 0.8, 0.5 or 0.35 micron technology, is fabricated, then these tolerances become progressively more critical due to the nearer spacing of device elements and contacts.

It is appreciated that a semiconductor device of the present invention provides for the shortcomings in the prior art device in order to fabricate semiconductor devices utilizing submicron technology under 1.0 microns, more notably the use of 0.8, 0.5 and 0.35 micron and smaller technologies. Furthermore, it is appreciated that techniques have been suggested for improving steps for submicron "double doped" source and drain. One such technique utilizing an inverse T-gate structure for submicron LD transistor is described in Huang et al.,"A Novel Submicron LDD Transistor with Inverse T-Gate Structure", IEEE IDEM, 1986, pp 742-745.

THE PREFERRED EMBODIMENT

Referring to FIG. 4, a semiconductor device 40 of the preferred embodiment is shown. Device 40 is a MOS device having a substrate 41 which is typically comprised of silicon. Field oxide regions 42 are formed on the substrate 41 to localize the formation of circuit elements. Field oxide regions are shown in FIG. 4 to isolate an area of device 40 for the formation of a given circuit element. A gate 44 is formed on substrate 41, which gate 41 is comprised of a polysilicon region 45 separated from the substrate 41 by a dielectric region 46. The dielectric region is typically comprised of an oxide, such as silicon dioxide (SiO2).

After the formation of gate 44, an oxide layer 47 is deposited over the device 40. In the preferred embodiment, oxide layer 47 is comprised of a conformally coated silicon dioxide (SiO2) and is deposited by a well-known suitable chemical vapor deposition (CVD) process in order to obtain the conformal topology (conformal meaning that the deposited layer conforms to the underlying topology). Such deposition of SiO2 is well-known in the prior art. CVD oxide layer 47 is deposited to a thickness range of approximately 100–1,000 angstroms. SiO2 is preferred in that SiO2 provides for minimal and controllable interface charge states afforded by SiO2 on the underlying silicon.

Referring to FIG. 5, a CVD conformal nitride layer 48 is next deposited over the CVD oxide layer 47. Nitride layer 48 is deposited by CVD, such as by thermal decomposition of silane SiH4 and ammonia NH4 to a thickness of approximately 100–1,000 angstroms. Thus the nitride layer 48 of the preferred embodiment is comprised of silicon nitride Si3N4, although any disposable material with good etch selectivity against SiO2 and Si can be used. Polysilicon can be used but is less preferred because of its conductance should any residue remain in the subsequent steps below.

Subsequently, both layers 47 and 48 are selectively etched to expose portions of the substrate 41 between the FOX regions 42 and gate 44. The exposed substrate areas will later form the source and drain regions about gate 44. Nitride layer 48 is etched with high selectivity to SiO2 first and then SiO2 layer 47 is etched with high selectivity to both silicon and nitride. This technique allows for end-point detection and highly defined staircase structure shown in FIG. 6. A dry anisotropic etch is used for both etch cycles.

Because of the formation of the nitride layer 48 above the oxide layer 47, several advantages are derived. The nitride etch provides for a more uniform etch cycle than the oxide etch, as well as having a better anisotropic properties. Additionally, because of the use of the nitride etch, the FOX regions 42 are not etched away which allows for controlled isolation (field inversion voltage threshold). It is to be noted that in the prior art device 10 of FIG. 1, oxide etching of the oxide layer 17 can cause portions of the FOX regions 12 to be etched away if the oxide layer 17 is not uniform in thickness. However, with device 40 of the present invention, nitride etch is used and, therefore, because of better selectivity, FOX regions 42 are not etched, at least not as severe as the oxide etch of the prior art device 10 and allowing for controlled isolation and controlled metal line parasitic capacitance.

Referring to FIG. 6, it illustrates device 40 after the nitride etching cycle. Because of the anisotropic properties of nitride etch, a portion of the oxide 47 adjacent to the sidewalls of the gate 44 remains intact. This sidewall spacer 52 is wider at the base, proximate to the substrate 41, because a portion 53 of the nitride layer 48 remains adjacent to spacer 52 due to the conformal topology of the earlier formed layers 47 and 48 and the fact that the nitride appears thicker due to the anisotropic etch on the sharp sidewall definition of gate 44. Subsequently, the nitride portion 53 is selectively removed by either isotropic or anisotropic nitride etch.

After the removal of nitride remnant 53, only the sidewall spacer 52 remains adjacent to gate 44. Due to the earlier overlying nitride 53 protecting the underlying oxide spacer 52, a staircase shape is provided for the shape of sidewall spacers 52, as is shown in FIG. 7.

It is to be noted that because of the conformal deposition of oxide layer 47, the thickness of the upper portion of spacer 52 is substantially equivalent to the thickness 51 of the lower portion of spacer 52. Thus, the thickness 50 of the spacer 52 adjacent to the gate 44 sidewall is determined by the thickness of conformal oxide layer 47.

It is to be appreciated that in some instances a portion of the original oxide layer 47 can remain atop the upper surface of gate 44. In other instances, the upper extent of the sidewall spacer 52 is below the plane formed by the upper surface of gate 44 thereby exposing a portion of the sidewall of gate 44. However, in all these instances the critical factor is in maintaining a substantially constant footprint for spacers 52 as is explained below.

FIG. 7 shows a footprint 54 of one oxide sidewall spacer 52. Footprint 54 can be separated by the disjunction 57 (which forms the staircase shape) of the surface of spacer 52 into footprint 55 and 56. Footprint 55 being determined by the width of the spacer 52 portion from the disjunction 57 to the gate 44 sidewall, which width being equivalent to the thickness 50. Footprint 56 being determined by the width of the spacer 52 portion from the disjunction 57 to the distal end of the lower portion of spacer 52.

It is to be appreciated that because of the earlier overlying nitride layer 48 and the selectivity of the nitride etch, the measurement of footprint 54 and, hence, footprints 55 and 56 can be kept to a close tolerance. Those parameters being dependent on thickness of layer 47 and 48 and the nitride etch step described above. That is, the width of the footprint 55 is determined by the thickness of the deposition of oxide layer 47, while the width of footprint 56 is determined by the thickness of the deposition of the nitride layer 48. The sum of the thicknesses of the two layers 47 and 48, therefore, determines the width of the total footprint 54.

Further, the slope formation of the spacer 22 of the prior art device 10 tended to vary causing the footprint 27 to vary, such slope variations are reduced because the overlying nitride area 53 is not present. The underlying spacer regions 52 are protected and thereby maintain a sharp profile and a smaller variance of footprints 55 and 56.

Referring to FIG. 8, a mask layer 60 is formed wherein the mask layer 60 retains exposed those areas where n− implantation is to occur. Next, n− implantation is achieved by using one of a variety of well-known self-aligned implantation techniques. The energy of the n− implantation is selected to be of sufficient value in order to have the ions penetrate through the lower portion 58 of the space 52 to reach the portion of the substrate corresponding to footprint 56, yet not of a high enough value to penetrate gate 44 and upper portion 59 of spacer 52.

The n− implantation step also implants the ions well into the exposed substrate 41. Thus, gate 44 and the upper portion 59 of the spacers 52, adjacent to the gate 44, provides for self-alignment during this implantation step. Each of the n− regions 63, formed on the opposites sides of gate 44, is formed in the substrate and extends into the substrate region underlying the lower portion 58 of the spacer 52 which is designated as footprint 56. As is noted in the drawing, the depth of the n− implant in the substrate underlying footprint 56 is not as deep as the implant region of the exposed substrate.

Referring to FIG. 9, it illustrates the subsequent n+ implantation step. It is to be noted that a different masking layer need not be used for the n+ implant, unlike the case with the prior art device of FIG. 2. The use of the same masking layer for both the n− and the n+ implants means that only one mask and masking step cycle need be used during fabrication of device 40 of the present invention. As is shown in FIG. 9, the same masking layer 60 is used for the n+ ion implant. The use of the sam masking step for both implants reduces the step count and allows for cost and yield-risk reduction in manufacturing.

Because the implant energy level is of sufficiently lower value, the lower portion 58 functions as a mask to prevent appreciable penetration of the n+ ions into the substrate region underlying the spacer. The n+ source and drain regions 64 in the substrate 41 substantially extends from the edge of the footprint 56 toward the FOX regions 42. At the end of the n+ implantation step, a "double doped" source and drain regions are present in which n+ region 64 is separated from the channel region underlying gate 44 by a n− region 63.

It is to be appreciated that in the practice of the present invention, the n+ region 64 can be implanted first and, then, subsequently followed by the n− implant to form n− region 63. In some instances, performing the n+ implant may afford added control of the n− profile, since part of the region may be amorphized thus limiting ion channeling effects.

Referring to FIG. 10, it shows a subsequent annealing step in which the n− and n+ regions 63 and 64 are diffused further into the substrate, including diffusion toward the channel region. Because of the tight tolerances obtained in the footprint 54 of spacer 52, as well as footprints 55 and 56, precise control can be obtained as to the extent of the horizontal diffusion of n− and n+ regions 63 and 64 toward the channel region. Thus, the n− region 63 can be extended to a position just underlying the sidewall of gate 44. This control allows turn-on characteristics and simultaneously provides for minimal overlap capacitance for source or drain to gate. That is, boundary of the n− region 63 diffuses from the footprint area 56 to footprint area 55, while the boundary of the n+ region 64 diffuses into the footprint area 56 (see FIG. 7) during the annealing step.

Because of the sharper distinction of the location of the boundary of each of the regions 63 and 64 in reference to the channel region in the device 40 of the present invention as compared to the prior art device a sharper definition such as tighter control of source-drain spacing, and source and drain doping profiles, of device elements is readily obtained. This improved definition provides for elements to be formed for use in devices fabricated utilizing submicron technologies, such as 0.8, 0.5 and 0.35 micron technologies.

Furthermore, it is to be appreciated that an equivalent technique can be used to provide for source and drain regions in a p-channel device. Instead of the n− implantation, p− implantation is performed. Conversely, instead of the n+ implant, p+ implant is used. As was the case with the n− channel device, either p− or p+ implant can be performed first. By controlling the oxide layer thickness, nitride layer thickness and energy of the implants, source and drain characteristics, profile and dimensions can be tightly controlled.

Referring to FIGS. 11-16, they show a complementary-metal-oxide semiconductor (CMOS) device 70 of the present invention fabricated on a silicon substrate. The formation of a p-channel well 41a and an n-channel well 41b within the p-well 41a is well-known in the prior art. An n-channel device 40a is fabricated in the p-well 41a, while a p-channel device 40b is fabricated in the n-well 41b. Fox regions 42a separate the p and n areas, as well as separating each area from other areas of circuit construction.

Referring to FIG. 11 after the formation of gates 44a and 44b above the substrate in each of the n-channel and p-channel device regions 41a and 41b, respectively, sidewall spacers are formed for each gate 44a and 44b according to the earlier described processes pertaining to FIGS. 4-6. Then, after the etching of the nitride remnants 53a and 53b, an n+/n− mask layer 60a is formed exposing the n-channel device area for implantation, as is shown in FIG. 12. The p-channel device area is covered during the n− and n+ implants. The n− implant is performed, which implant is equivalent to that of the process described in reference to FIG. 8 to form n− regions 63a in the p-well 41a. Next, using the same masking layer 60a, a n+ region 64a is formed in the substrate according to the earlier described process in reference to FIG. 9. Thus the n-channel device 40a, which is equivalent to device 40 of FIG. 9, is formed in the p-well 41a.

Then a p+/p− mask layer 60b is formed, exposing the p-channel device area for implantation as is shown in FIG. 14. Next, a p− implant is performed according to the earlier described process. Subsequently, as is shown in FIG. 15, a p+ implant is achieved. The p-channel device 40b fabricated in the n-well 41b is equivalent to the earlier described device 40 of FIG. 9, except that it is a p-channel device having p− and p+ implants. Then, during an annealing step n−, n+, p−, and p+ regions 63a, 64a, 63b, and 64b are diffused to provide equivalent n-channel and p-channel devices as that described in reference to FIG. 10. The final product is the CMOS device 70 shown in FIG. 16, having the n-channel and the p-channel devices fabricated according to the practice of the present invention. The CMOS device 70 being fabricated utilizing submicron technology, such as 0.8, 0.5, 0.35 and smaller micron technology. Again, either the n− or the n+, as well as the p− or the p+, implants can be performed first.

Figure 17:
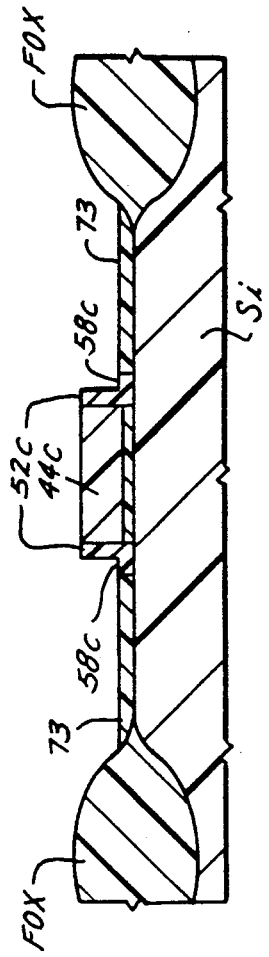
FIG. 17 is a cross-sectional view showing an alternative embodiment in which an elevated polysilicon layer is formed above a substrate and adjacent to sidewall spacers of the present invention.

Referring to FIG. 17, an alternative embodiment of the present invention is shown. After the formation of the gate 44c, sidewall spacers 52c, and removal of the remnant nitride about the sidewall spacers 52c according to the earlier described processes of the present invention, a polysilicon layer 73 is formed above each of the exposed substrate areas. The formation and use of such "elevated polysilicon" (elevated poly) layer is well known and such techniques are described in Oh et al., "A New MOSFET Structure with Self-Aligned Polysilicon Source and Drain Electrodes", IEEE Electron Device Letters, Vol. EDL-5, No.10, Oct. 1984, pp 400-402; and in Yamada et al., "Spread Source/Drain (SSD) MOSFET Using Selective Silicon Growth for 64Mbit DRAMs, IEEE IEDM, 1989, pp35-38.

After the formation of the elevated poly 73, n− and n+ implants 63c and 64c are performed according to the earlier described steps in practicing the present invention. During the annealing step diffusion is achieved a earlier described to control the doping profiles under the foot region. Additionally, during the annealing step, salicidation (salicidation is the formation of metal silicide on both the source and drain and/or the self-aligned gate regions) of the elevated silicon may occur, if a silicide forming metal, such as titanium or cobalt for example, is present.

Figure 18:
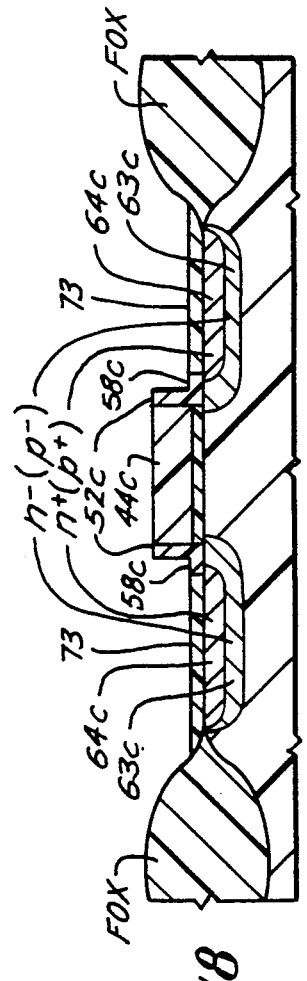
FIG. 18 is a cross-sectional view showing a formation of n−/n+ source and drain regions underlying the elevated polysilicon of FIG. 17.
Figure 21:
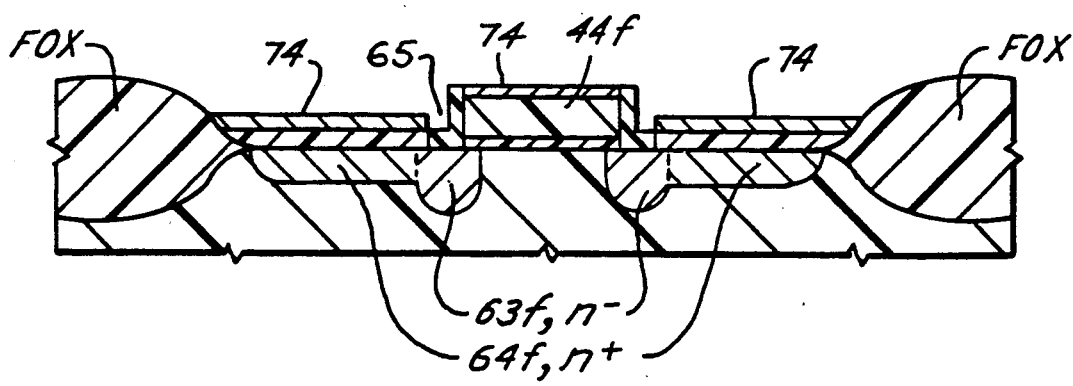
FIG. 21 is a cross-sectional view of the elevated polysilicon device of FIG. 20, but having a subsequent salicidation layer.

The final result is illustrated in FIG. 18. Although the silicide layers overlying the polysilicon are not explicitly shown in FIG. 18, such formation of silicide layers is shown in FIG. 21, and can be readily formed on the polysilicon (both elevated and gate poly) layers shown in FIG. 18. It is to be appreciated that an equivalent technique can be readily used to fabricate a p-channel device employing the elevated poly.

The thickness of the lower portion 58c (foot portion of the staircase) of spacer 52c can be designed less than, equal to, or greater than the thickness of the polysilicon 73. Subsequent source/drain regions can then be formed in the polysilicon 73, as well as in the base substrate.

Figure 19:
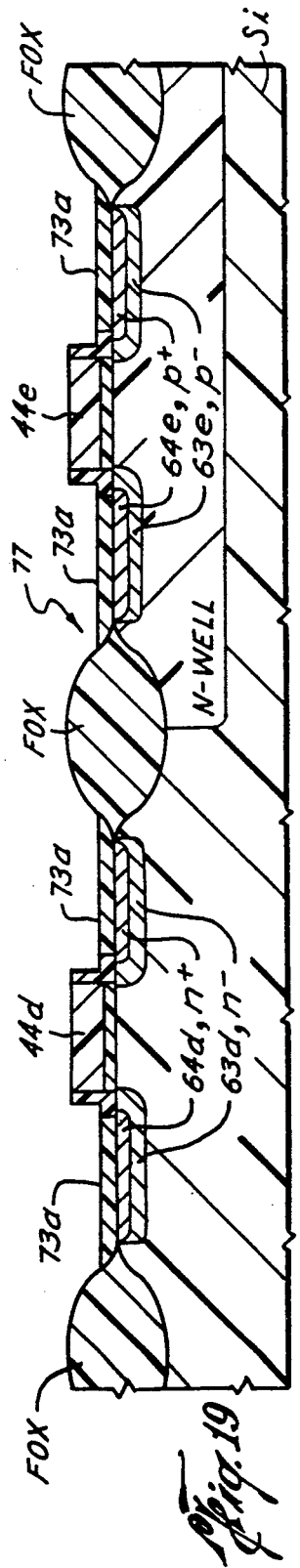
FIG. 19 is a cross-sectional view showing a CMOS device of the alternative embodiment in which n−/n+ and p−/p+ source and drain regions are formed underlying elevated polysilicon.

In FIG. 19, a CMOS device 77 is shown in which it is equivalent to the CMOS device 70 described in reference to FIG. 16, except that the source and drain regions of both n-channel device and p-channel device elements 63d, 64d, 63e, 64e have the elevated poly 73a. A significant advantage of using an elevated poly technique is that the implant ions are implanted or deposited into the elevated poly prior to diffusing dopant into the substrate. Hence, implant damage and doping initially is contained primarily in the elevated poly and not in the actual single crystal substrate. This may decrease the source/drain to substrate capacitance and reduce junction leakage. Implantation into fine grain polysilicon elevated drains provides a fast lateral diffusion medium so that shadowing effects that normally exist by implanting past masking gates into crystalline silicon are overcome.

Figure 20:
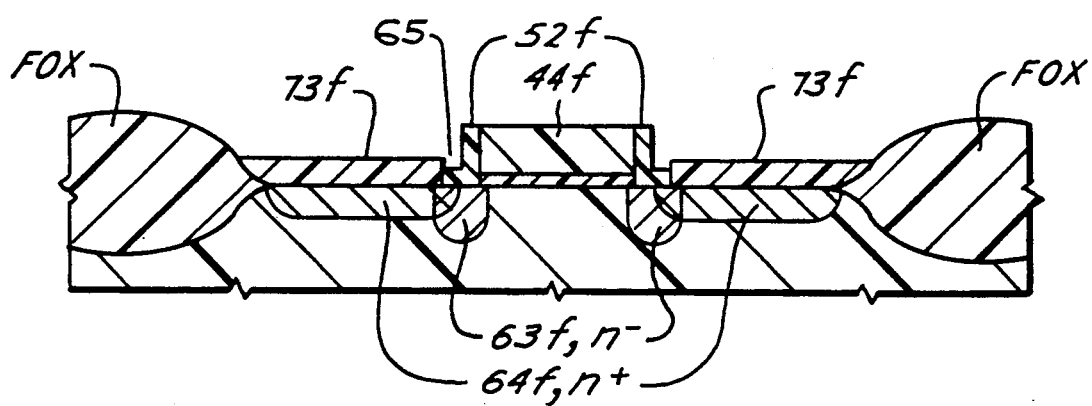
FIG. 20 is a cross-sectional view showing a CMOS device of another alternative embodiment in which an elevated polysilicon layer is formed above a substrate and adjacent to sidewall spacers, but having a thickness that elevates the polysilicon layer above the foot of the spacer in order to implant a narrow region in the substrate.

Referring to FIG. 20, another alternative embodiment using elevated polysilicon 73f is shown. In this embodiment, polysilicon 73f is thicker than the lower portion (foot) of the spacer 52f. By making the lower portion of the spacer thinner than the elevated drains, one can selectively dope the n− regions. Alternately, a depression 65 is formed between the spacer 52f and the polysilicon 73f. When n− implant is performed at a controlled energy level, an n− region forms in the substrate substantially under the depression 65. Then the n+ implant is implanted at low energy into the elevated polysilicon and finally diffused into the substrate underlying the polysilicon 73f and to a limited extent into the substrate underlying the depression 65. Thus a narrow n− pocket region 63f is formed between the n+ region 64f and the channel region. Again either n− or n+ implant can be performed first. This technique is also applicable to p-channel devices as well. The resultant structure, with subsequent salicide metalization layer 74 is shown in FIG. 21.

Thus, a staircase sidewall spacer for improved source/drain formation is described. It is readily evident that a variety of doping profiles can be obtained with different performance objectives under greater control than by the practice of the prior art. Although a particular description is provided above, it is appreciated that other techniques can be readily implemented without departing from the spirit and scope of the present invention. For example, the present invention can be readily practiced with BiCMOS technology as well.

We claim:

1. A process for fabricating a semiconductor device, having a gate formed on a substrate, wherein source and drain are formed in said substrate adjacent to a channel region underlying said gate, comprising the steps of:

depositing a conformal oxide layer over said substrate and said gate;

depositing a conformal nitride layer over said oxide layer;

etching selectively said nitride and said oxide layers anisotropically until a portion of said substrate is exposed, but retaining a portion of said oxide which is adjacent to each sidewall of said gate in order to form sidewall spacers, each said spacer having a portion of said nitride layer remaining thereon;

removing by selective etch-back said portion of said nitride layer remaining on each said spacer to expose underlying oxide spacer, wherein each of said oxide spacers has an upper portion having a first width, and a base portion having a second width and partly underlying said upper portion to form a staircase shape;

said first width being approximately equal to the thickness of said oxide layer and said second width being approximately equal to the sum of the thicknesses of said oxide and nitride layers;

forming an elevated polysilicon layer above said exposed substrate;

implanting first ions at a first energy level, wherein said first ions are implanted into said elevated polysilicon layer and substrate underlying said elevated polysilicon layer and substrate underlying the lower staircase portion of said oxide spacers to form first doped regions in said substrate;

implanting second ions at a second energy level which is a lower energy level than said first energy level, wherein said second ions are implanted substantially into said elevated polysilicon layer and into said oxide spacers to form second doped regions in said substrate underlying said elevated polysilicon layer;

said dimensional tolerance of said spacers providing for precise location of lightly doped and heavily doped regions which form double-doped source and drain;

annealing said implanted source and drain wherein said source and drain diffuse further into said substrate, but said source and drain not extending substantially into said channel region underlying said gate.

2. The process of claim 1 wherein said first doped regions are n− regions obtained by an n− implant and said second doped regions are n+ regions obtained by an n+ implant.

3. The process of claim 2 wherein said step of implanting said second ions to form said n+ regions is achieved prior to said step of implanting said first ions to form said n− regions.

4. The process of claim 1 wherein said first doped regions are p− regions obtained by a p− implant and said second doped regions are p+ regions obtained by a p+ implant.

5. The process of claim 4 wherein said step of implanting said second ions to form said p+ regions is achieved prior to said step of implanting said first ions to form said p− regions.

6. A process for fabricating a complementary-metal-oxide semiconductor (CMOS) integrated circuit, having an n-channel device and a p-channel device formed on a substrate, each of said n-channel and p-channel devices having a gate formed respectively on said substrate, wherein source and drain are formed in said substrate adjacent to a channel region underlying respective one of said gates, comprising the steps of:

depositing a conformal oxide layer over said substrate and said gates;

depositing a conformal nitride layer over said oxide layer;

etching selectively said nitride layer anisotropically;

etching selectively said oxide layer anisotropically until a portion of said substrate is exposed, but retaining a portion of said oxide layer which is adjacent to each sidewall of said gates in order to form sidewall spacers, each said spacer having a portion of said nitride layer remaining thereon;

removing by selective etch-back said portion of said nitride layer remaining on each said spacer to expose its underlying oxide spacer, wherein each of said oxide spacer has an upper portion having a first width, and a base portion having a second width and partly underlying said upper portion to form a staircase shape;

said first width being approximately equal to the thickness of said oxide layer and said second width being approximately equal to the sum of the thicknesses of said oxide and nitride layers;

forming an elevated polysilicon layer above said exposed substrate;

implanting n− ions at a first energy level, wherein said n− ions are implanted into said elevated polysilicon layer and substrate underlying said elevated polysilicon layer and substrate underlying the lower staircase portion of said oxide spacers of said n-channel device to form n− doped regions in said substrate;

implanting n+ ions at a second energy level which is a lower energy level than said first energy level, wherein said n+ ions are implanted substantially into said elevated polysilicon layer and into said oxide spacers to form n+ doped regions in said substrate underlying said elevated polysilicon layer of said n− channel device, but wherein said n+ ions are substantially blocked by said base portion of each of said oxide spacers adjacent to said n-channel gate;

implanting p− ions at a third energy level, wherein said p− ions are implanted into said elevated polysilicon layer and substrate underlying said elevated polysilicon layer and substrate underlying the lower staircase portion of each of said oxide spacers of said p-channel device to form p− doped regions in said substrate;

implanting p+ ions at a fourth energy level which is a lower energy level than said third energy level, wherein said p+ ions are implanted substantially into said elevated polysilicon layer and into said oxide spacers to form p+ doped regions in said substrate underlying said elevated polysilicon layer of said p-channel device, but wherein said p+ ions are substantially blocked by said base portion of each of said oxide spacers adjacent to said p-channel gate;

said dimensional tolerance of said spacers providing for precise location of said doped regions which form double-doped source and drain for each of said n-channel and p-channel devices;

annealing said implanted sources and drains wherein said sources and drains diffuse into said substrate, but said sources and drains not extending substantially into said channel regions under their respective gates.

7. The process of claim 6 wherein said step of implanting said n+ ions to form said n+ doped regions is achieved prior to said step of implanting n− ions to form said n− doped regions.

8. The process of claim 7 wherein said step of implanting said p+ ions to form said p+ doped regions is achieved prior to said step of implanting p− ions to form said p− doped regions.

9. The process of claim 6 wherein the thickness of said oxide layer is approximately 100–1,000 angstroms and the thickness of said nitride layer is approximately 100–1,000 angstroms.

10. A process for fabricating a submicron-dimensioned semiconductor device, having a gate formed on a substrate, wherein source and drain regions are formed in said substrate adjacent to a channel region underlying said gate, comprising the steps of:

depositing a conformal oxide layer having a thickness in the range of 100–1,000 angstroms over said substrate and said gate;

depositing a conformal nitride layer having a thickness in the range of 100–1,000 angstroms over said oxide layer;

etching selectively said nitride and said oxide layers anisotropically until a portion of said substrate is exposed, but retaining a portion of said oxide which is adjacent to each sidewall of said gate in order to form sidewall spacers, each said spacer having a portion of said nitride layer remaining thereon;

removing by selective etch-back said portion of said nitride layer remaining on each said spacer to expose underlying oxide spacer, wherein each of said oxide spacer has an upper portion having a first width and a base portion having a second width and partly underlying said upper portion to form a staircase shape;

said first width being determined by the thickness of said oxide layer and said second width being determined by the sum of the thicknesses of said oxide and nitride layers;

forming an elevated polysilicon layer above said exposed substrate, said polysilicon layer having a thickness at least that of said conformal oxide layer;

implanting first ions at a first energy level, wherein said first ions are implanted at least into said substrate underlying the lower staircase portion of said oxide spacers to form first doped regions in said substrate;

implanting second ions at a second energy level substantially into said elevated polysilicon layer and into said oxide spacers to form second doped regions in said substrate underlying said elevated polysilicon layer;

said dimensional tolerance of said spacers providing for precise location of lightly doped and heavily doped regions which form double-doped source and drain for said submicron-dimensioned semiconductor device;

annealing said implanted source and drain wherein said source and drain diffuse further into said substrate, but said source and drain not extending substantially into said channel region underlying said gate, each of said source and drain having said first doped region separating said second doped region from said channel underlying said gate.

11. The process of claim 10 wherein said first doped regions are an n− region obtained by an n− implant and said second doped regions are an n+ region obtained by an n+ implant.

12. The process of claim 11 wherein said step of implanting said second ions to form said n+ regions is achieved prior to said step of implanting said first ions to form said n− regions.

13. The process of claim 10 wherein said first doped regions are a p− region obtained by a p− implant and said second doped regions are a p+ region obtained by a p+ implant.

14. The process of claim 13 wherein said step of implanting said second ions to form said p+ regions is achieved prior to said step of implanting said first ions to form said p− regions.

* * * * *

UNITED STATES PATENT AND TRADEMARK OFFICE
CERTIFICATE OF CORRECTION

PATENT NO. : 5,102,816
DATED : April 7, 1992
INVENTOR(S) : V. Reddy Manukonda and Thomas E. Seidel It is certified that error appears in the above-identified patent and that said Letters Patent is hereby corrected as shown below:

Column 2, line 6, before "particularly" insert --,--.

Column 6, line 6, "LD" should be --LDD--.

Column 8, line 32, "sam" should be --same--.

Column 9, line 4, before "a" insert --,--.

Signed and Sealed this

Seventeenth Day of August, 1993

Attest:

BRUCE LEHMAN

Attesting Officer

Commissioner of Patents and Trademarks